United States Patent
Chen et al.

(10) Patent No.: US 7,163,840 B2
(45) Date of Patent: Jan. 16, 2007

(54) FLIP CHIP PACKAGE AND MANUFACTURING METHOD THEREOF

(75) Inventors: Yu-Wen Chen, Kaohsiung (TW); Chih-Ming Chung, Kaohsiung County (TW); Chi-Hao Chiu, Pintung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 226 days.

(21) Appl. No.: 10/709,588

(22) Filed: May 17, 2004

(65) Prior Publication Data
US 2004/0229399 A1 Nov. 18, 2004

(30) Foreign Application Priority Data
May 16, 2003 (TW) .............................. 92113290 A

(51) Int. Cl.
*H01L 21/48* (2006.01)
*H01L 21/50* (2006.01)
(52) U.S. Cl. ............... 438/108; 438/122; 257/E21.499
(58) Field of Classification Search ................ 438/106, 438/108, 118, 121, 122
See application file for complete search history.

(56) References Cited

U.S. PATENT DOCUMENTS

| 6,187,613 | B1 * | 2/2001 | Wu et al. ................... 438/108 |
| 6,600,232 | B1 * | 7/2003 | Chiu et al. ................. 257/778 |
| 6,602,740 | B1 * | 8/2003 | Mitchell .................... 438/127 |
| 6,617,682 | B1 * | 9/2003 | Ma et al. ................... 257/706 |
| 6,979,600 | B1 * | 12/2005 | Brandenburger ............ 438/127 |

* cited by examiner

*Primary Examiner*—Scott B. Geyer
(74) *Attorney, Agent, or Firm*—Jiang Chyun IP Office

(57) ABSTRACT

A flip chip package structure and manufacturing method thereof is provided. A chip is electrically connected to a substrate. A heat sink is attached to the backside of the chip. The heat sink has at least a through hole located at a peripheral region and laterally adjacent to the chip. A dispensing process is carried out to deliver an underfill material via the through hole such that the space between the chip and the substrate is filled. The underfill material also extends to cover a portion of the heat sink so that the heat sink and the substrate are connected together. The underfill material is cured to fix the heat sink, the substrate and the chip in position.

9 Claims, 5 Drawing Sheets

FLIP CHIP PACKAGE AND MANUFACTURING METHOD THEREOF

CROSS REFERENCE TO RELATED APPLICATIONS

This application claims the priority benefit of Taiwan application serial no. 92113290, filed May 16, 2003.

BACKGROUND OF INVENTION

1. Field of the Invention

The present invention relates to a flip chip package with a heat sink and manufacturing method thereof. More particularly, the present invention relates to a flip chip package that uses underfill material to firmly fasten a substrate and a heat sink within the package and the manufacturing method thereof.

Description of the Related Art

Flip chip interconnect technology is a method of bonding a chip to a substrate as well as connecting the two electrically. To form a flip chip package, a chip with an array of bonding pads formed on an active surface is provided. Bumps are formed over the bonding pads. Thereafter, the chip is flipped over such that the contacts on a substrate are aligned with the respective bumps on the chip. Thus, the substrate and the chip are electrically and mechanically connected via the bumps so that the chip is able to communicate with an external device through the internal circuits inside the substrate.

It is known that the flip chip technology is capable of producing a chip package having a high pin count while reducing overall package area and shortening overall signal transmission pathways at the same time. Consequently, flip chip technique has been widely adopted in the fabrication of many types of chip packages. The most common type of flip chip package structure includes the so-called "flip chip ball grid array" (FC/BGA), for example. However, as the operational speed of the chip is increased, more efficient heat-dissipating device must be accompanied.

To increase heat-dissipating efficiency, a heat sink is frequently attached to the backside of a FC/BGA package. In the conventional technique, a reflow process is carried out after a chip is flipped over (the active surface facing downward) and aligned on top of a substrate so that the bumps on the surface of the chip re-melt and bond with corresponding contacts on the substrate. Because the substrate and the chip have widely different coefficient of thermal expansion, considerably stress may build up between the chip and the bumps under thermo cycles. Ultimately, the chip may crack or else the package may warp noticeably.

SUMMARY OF INVENTION

Accordingly, one object of the present invention is to provide a flip chip package having an improved reliability.

To achieve these and other advantages and in accordance with the purpose of the invention, as embodied and broadly described herein, the invention provides a method of forming a flip chip package structure whose chip and substrate are electrically connected. The chip has an active surface and a corresponding backside. The active surface comprises a plurality of bumps. The chip and the substrate are connected together via the bumps. A heat sink is attached to the backside of the chip. The heat sink comprises at least a through hole located in the periphery of the chip. Via the through hole, a dispensing process is performed by injecting underfill material not only to fill up the space between the active surface of the chip and the substrate but also to cover a portion of the heat sink to connect the heat sink and the substrate. Thus, the heat sink and the substrate are glued together by the underfill material. Finally, the underfill material is cured to fix the heat sink, the substrate and the chip in position.

The aforementioned dispensing process includes passing a dispensing needle through the through hole to provide the underfill material for filling the space between the substrate and the chip as well as covering a portion of the heat sink to connect the substrate and the heat sink.

This invention also provides a flip chip package structure comprising a chip, a substrate, a heat sink and an underfill material. The chip has an active surface and a corresponding backside. The active surface of the chip comprises a plurality of bumps thereon. The chip and the substrate are boned together through the bumps on the active surface. The heat sink is attached to the backside of the chip. The heat sink comprises at least a through hole disposed around the peripheral region of the chip. The underfill material not only fills up the space between the active surface of the chip and the substrate, but also connects the heat sink with the substrate.

The aforementioned through hole is positioned around the peripheral region and laterally adjacent to the chip.

Furthermore, the heat sink comprises an upper surface and a lower surface. The lower surface further comprises at least a stopper just outside the through hole for blocking an outward expansion of the underfill material so that the injected underfill material is forced to remain within an area in the neighborhood of the chip.

In the aforementioned flip chip package, the underfill material is an epoxy resin. Preferably, the underfill material is a thermal-set epoxy resin that can be cured by heating so that the underfill material is able to fasten the heat sink and the substrate firmly together.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
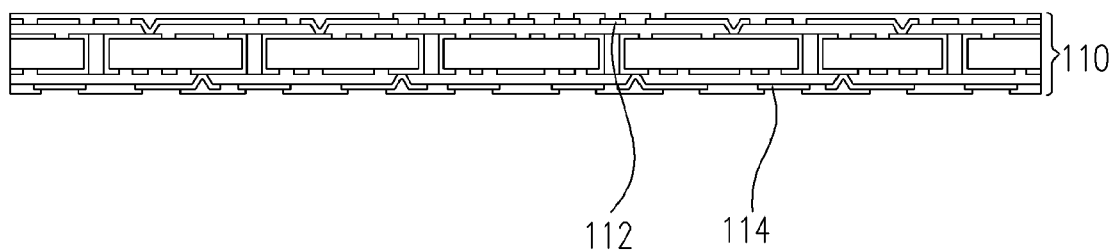
FIGS. 1 through 6 are schematic cross-sectional views showing the progression of steps for fabricating a flip chip package with a heat sink thereon according to a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

The First Embodiment

FIGS. 1 through 6 are schematic cross-sectional views showing the progression of steps for fabricating a flip chip package with a heat sink thereon according to a first embodiment of this invention. In this embodiment, the fabrication of a flip chip ball grid array package is used as an example.

As shown in FIG. 1, a substrate 110 having a plurality of bonding pads (such as bump pads) on one side and a plurality of ball pads 114 on the other side is provided.

Figure 2:
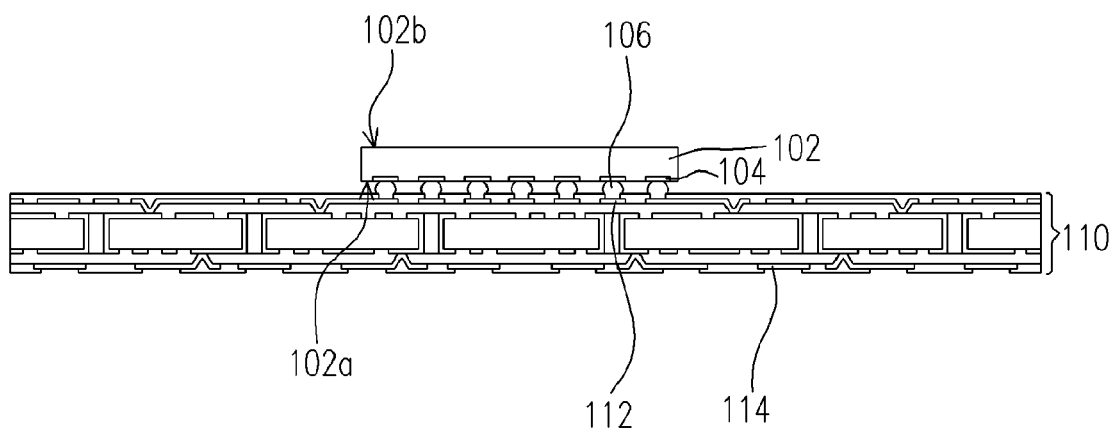

As shown in FIG. 2, a chip 102 having an active surface 102a and a backside 102b is provided. The active surface 102a of the chip 102 comprises a plurality of bonding pads 104 and each bonding pad 104 has a bump 106 attached thereon. The chip 102 is flipped over so that the bumps 106 on the active surface 102a align with the bump pads 112 on the substrate 110. Thereafter, a reflow process is performed so that the bumps 106 melt to connect with the bump pad 112 on the substrate 110.

Figure 3:
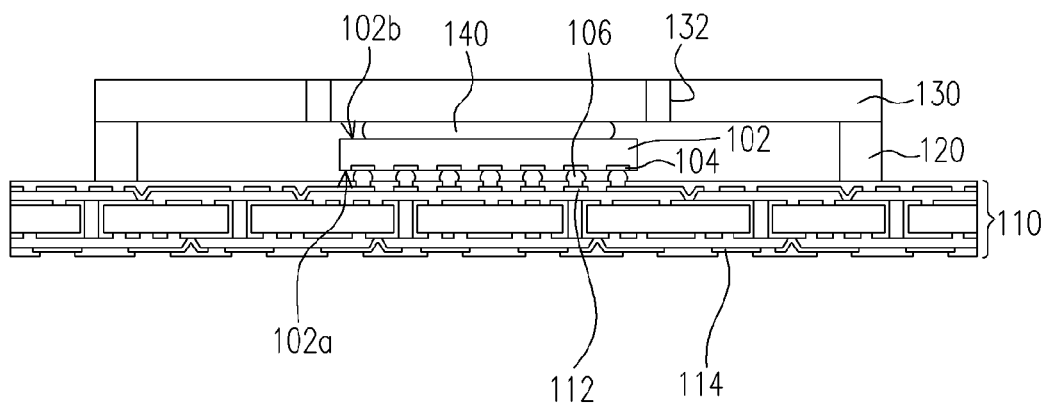
Figure 7:
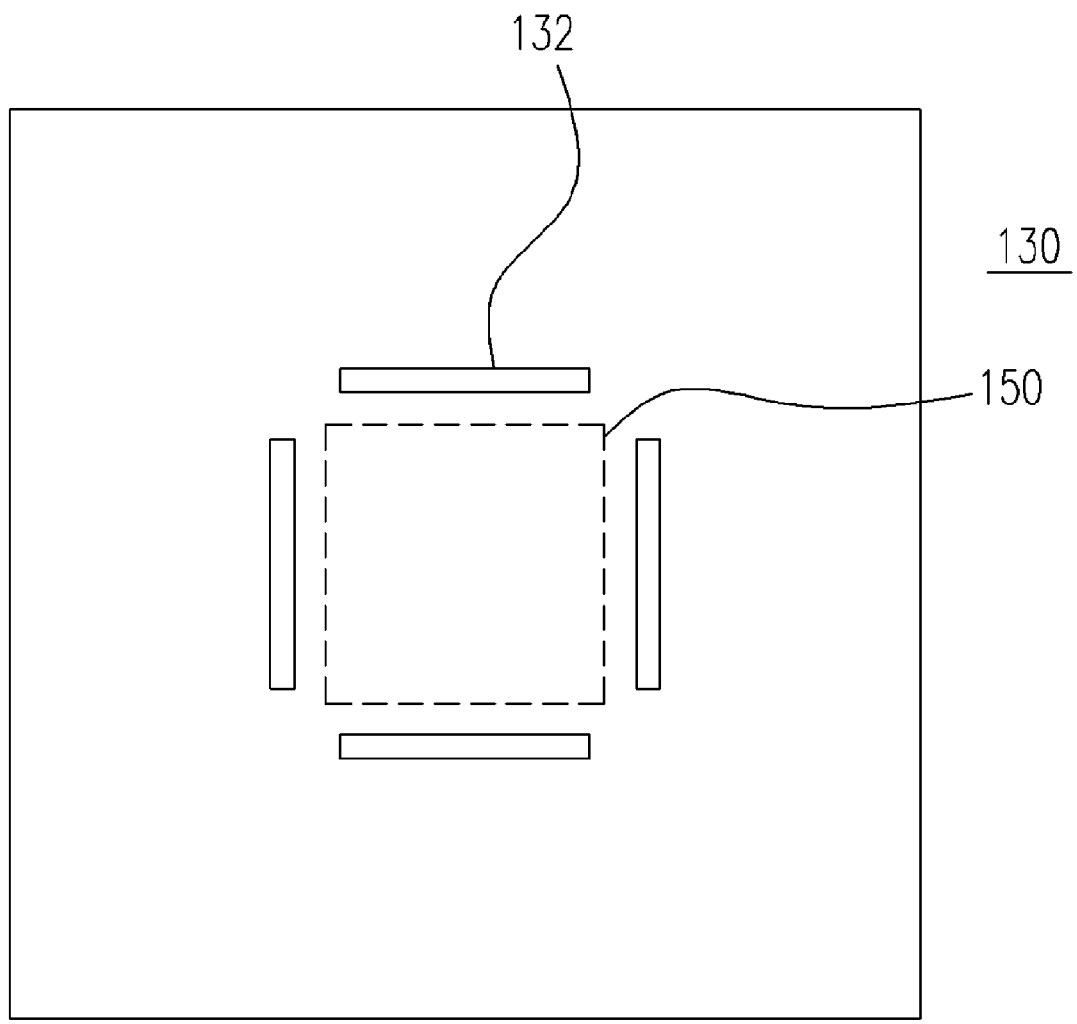
FIG. 7 is a planar view of a heat sink according to the first embodiment of this invention.

As shown in FIG. 3, a stiffener ring 120 is placed on the substrate 110 around the chip 102. Thereafter, a heat sink 130 is attached to the backside 102b of the chip 102. The stiffener ring 120 connects the substrate 110 and the heat sink 130. In other cases, if the heat sink is in a specific shape, for example, a reversed-U-shape, and the heat sink can be directly attached to the substrate 110, the stiffener ring 120 can be omitted. FIG. 7 is a planar view of a heat sink according to the first embodiment of this invention. The heat sink 130 comprises at least a through hole 132 (four through holes are shown in FIG. 7). The through hole 132 is set in the peripheral region and laterally adjacent to the chip 102. In FIG. 7, the region 150 enclosed by dash lines indicates the location of the chip 102. Although the through hole 132 is shown to have a rectangular profile, there is no fixed profile as long the through hole 132 is formed around and close to the area where the chip 102 is positioned. There is also no fixed limit on the number of through holes 132 on the heat sink 130.

Furthermore, to enhance the heat-dissipating capacity, a thermal conductive layer 140, for example, made of thermal conductive glue may be applied to the backside 102b of the chip 102 prior to attaching the heat sink 130 to the chip 102.

Figure 4:
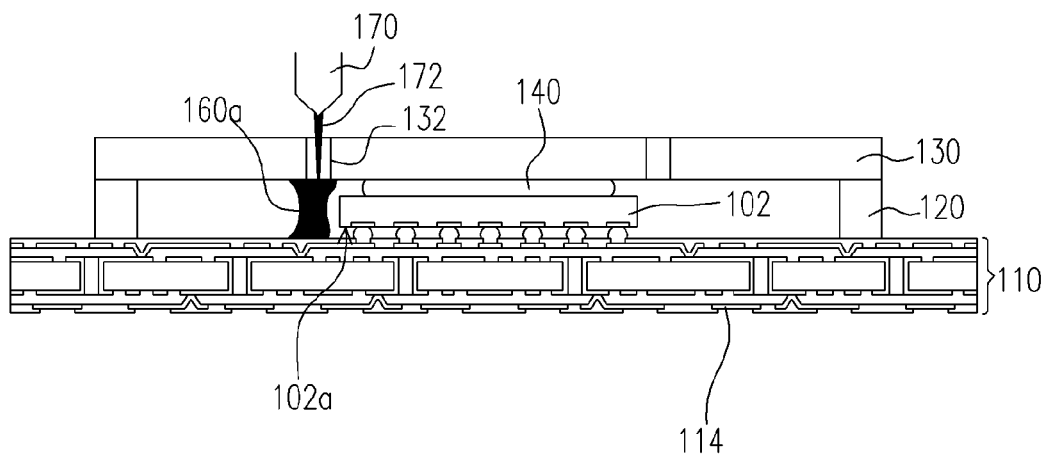
Figure 5:
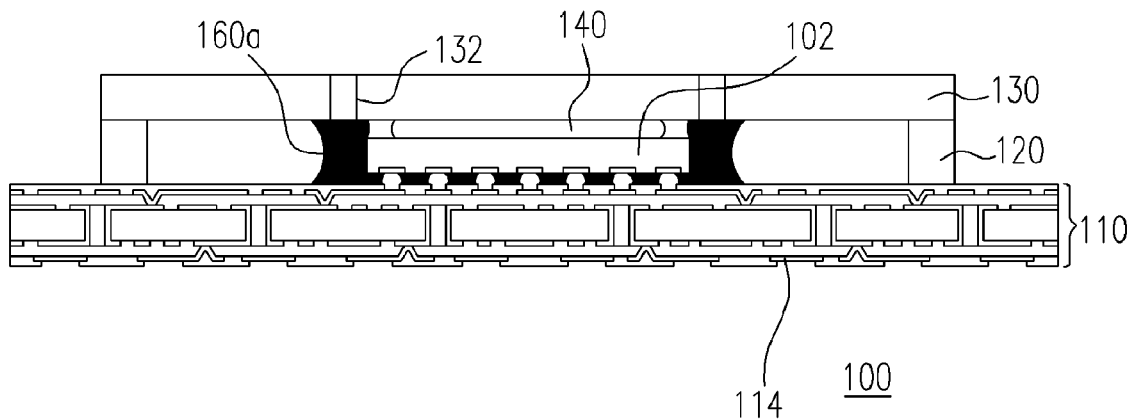

As shown in FIG. 4, a dispensing process is carried out using a needle 172 of a dispensing nozzle 170. In the dispensing process, the needle 172 of the dispensing nozzle 170 passes through the through hole 132 and injects underfill material 160a to fill up the space between the active surface 102a of the chip 102 and the substrate 110 through a capillary action. Through the capillary action, some of the underfill material 160a is able to creep over the heat sink 130 to form a fillet of underfill layer as shown in FIG. 5. Preferably, the heat sink 130 has a coefficient of thermal expansion comparable to the substrate 110 including, for example, a copper or an aluminum plate. Hence, a sandwiched beam structure comprising high-strength facial layers (substrate 110 and heat sink 130) and a core layer (underfill material 160a that encloses the chip 102) is produced.

Thereafter, the underfill material 160a is cured to fix the heat sink 130, the substrate 110 and the chip 102 in positions. With this structural setup, the underfill material 160a that is regarded as the core layer is able to absorb most of the stress and relieve the stress at the chip contacts (the bumps 106). In addition, because the coefficient of thermal expansion of the substrate 110 and the heat sink 130 which are disposed on each side of the underfill material 160a are comparable, and therefore warping or distortion is greatly reduced. Thus, fatigue strength and reliability of the package can be effectively promoted. Moreover, the stiffener ring 120 and the underfill material 160a also provide some resistant when the heat sink 130 is subjected to an external pressure. Hence, the chip 102 is shielded against most sources of stress.

Figure 6:
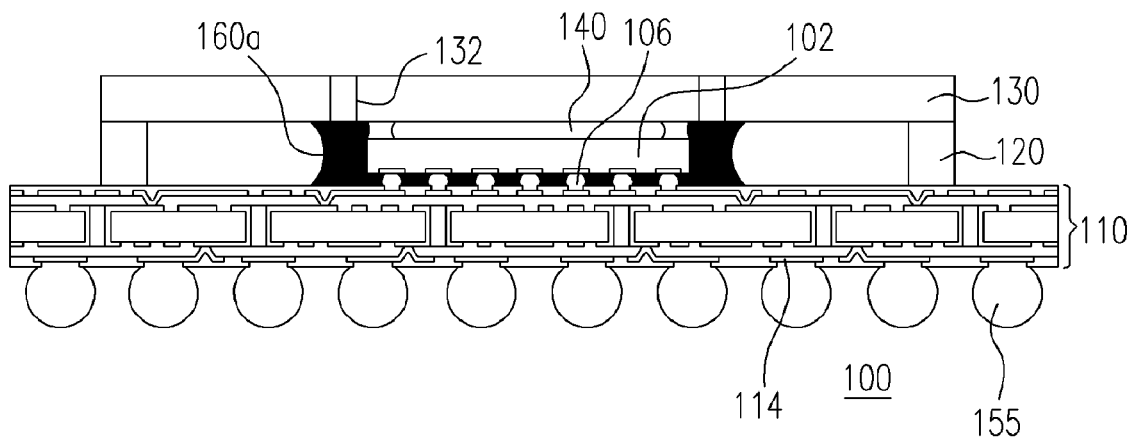

As shown in FIG. 6, an operation is carried out to plant solder balls 155 to the ball pads 114. Thus, the chip 102 is electrically connected to the solder balls 155 on the other side of the substrate 110 through the bumps 106 and the circuits within the substrate 110.

The Second Embodiment

Figure 8:
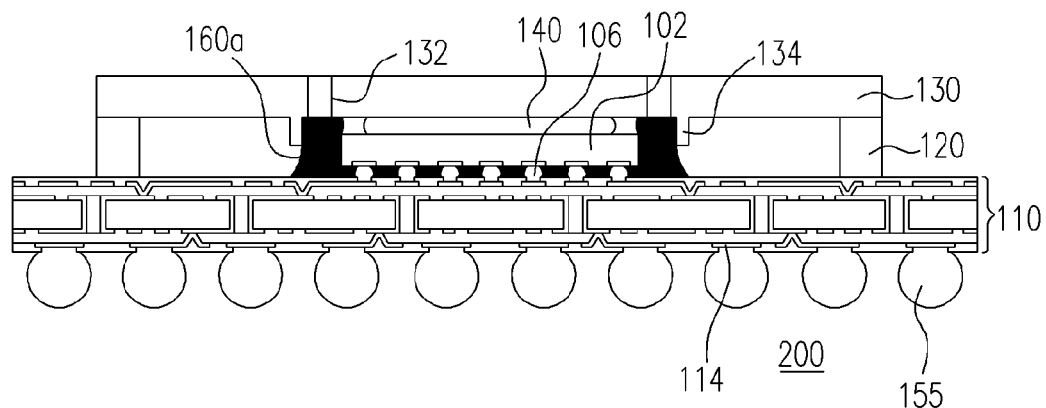
FIG. 8 is a schematic cross-sectional view of a flip chip package structure according to a second embodiment of this invention.

FIG. 8 is a schematic cross-sectional view of a flip chip package structure according to a second embodiment of this invention. The main difference between the flip chip package structure 200 in the second embodiment and the first embodiment (FIG. 6) is that a stopper 134 is added. The stopper 134 is located beneath the heat sink 130 just outside the through hole 132 for holding back the underfill material 160a in the neighborhood of the chip 102. Here, there is no particular restriction on the shape of the stopper 134. For example, the stopper 134 can be a baffle plate or extension protruding downward from the lower surface of the heat sink 130. In general, the stopper 134 is disposed outside the perimeter of the chip 102, and near or at one side of the through hole 132 further away from the chip 102.

The Third Embodiment

Figure 9:
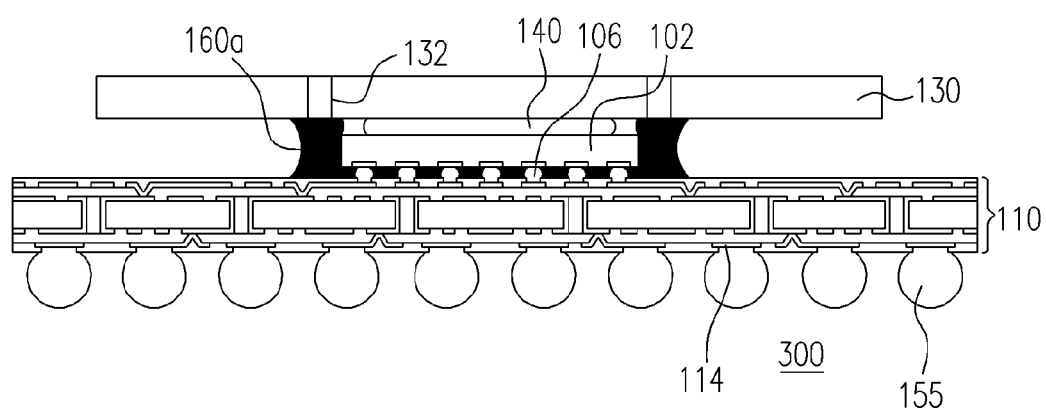
FIG. 9 is a schematic cross-sectional view of a flip chip package according to a third embodiment of this invention.

FIG. 9 is a schematic cross-sectional view of a flip chip package according to a third embodiment of this invention. The main difference between the flip chip package structure 300 in the third embodiment and the first embodiment (FIG. 6) is that the stiffener ring 120 is absent. Since all other aspects and advantages of the third embodiment are identical to the first embodiment, detailed description is not repeated here.

Because the underfill material 160a fills the space between the active surface 102a of the chip 102 and the substrate 100 and covers a portion of the heats sink 130 to fasten the substrate 100 and the heat sink 130 tightly together, there is little warping in the flip chip package 300. Hence, with the strengthening underfill material 160a delivered via the through hole 132, the stiffener ring 120 (shown in FIG. 6) can be eliminated. Also a heat sink that directly contacts with the substrate can be used here.

In all the aforementioned embodiments, a flip chip ball grid array package is chosen in all the illustrations. However, this should not limit the scope of the invention as such. In fact, this invention can be applied to fabricate any flip chip package with a heat sink.

Furthermore, the dispensing process performed by way of the through hole in the heat sink after attaching the heat sink to the chip not only fixes the chip to the substrate and the heat sink to the chip but also binds the heat sink to the substrate as well. Thereafter, the curing process fixes the heat sink and the substrate. Hence, the overall processing steps for fabricating the flip chip package according to this invention are simplified.

In addition, through the injection underfill material via the through hole and the subsequent curing process, the package is structurally reinforced. Moreover, the substrate and the heat sink forming the sides of a sandwiched beam structure are fabricated using materials having comparable coefficient of thermal expansion. Therefore, the core layer fabricated using underfill material is able to absorb most of the stress and reduces the stress acting on the chip contacts (bumps).

Ultimately, warping of the flip chip package is minimized and reliability of the package is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method of fabricating a flip chip package, comprising the steps of:
   providing a substrate;
   connecting a chip to the substrate, wherein the chip comprises an active surface and a corresponding backside and the active surface comprises a plurality of bumps such that the chip and the substrate are electrically connected through the bumps;
   attaching a heat sink to the backside of the chip, wherein the heat sink comprises at least a through hole located outside a perimeter of the chip, and has a size significantly larger than a size of the chip;
   performing a dispensing process via the through hole by injecting an underfill material into a space between the active surface of the chip and the substrate, wherein a space between the heat sink and the substrate is not completely filled by the underfill material; and
   curing the underfill material to fix the substrate and the chip.

2. The method of claim 1 wherein the dispensing process comprises passing a dispensing needle through the through hole to deliver the underfill material to the space between the chip and the substrate as well as the heat sink.

3. The method of claim 1, wherein the through hole is positioned outside the perimeter of the chip and adjacent to the chip.

4. The method of claim 1, wherein the heat sink has a coefficient of thermal expansion comparable to the substrate.

5. The method of claim 1, wherein the heat sink comprises an upper surface and a lower surface, and wherein the lower surface further comprises at least a stopper on an outer edge of the through hole.

6. The method of claim 1, wherein before the step of attaching the heat sink to the chip, further comprises applying a thermal conductive layer to the backside of the chip.

7. The method of claim 1, wherein the underfill material comprises epoxy resin.

8. The method of claim 7, wherein the epoxy resin comprises a thermal-setting epoxy resin.

9. The method of claim 1, wherein the step of performing the dispensing process further comprises injecting the underfill to cover a portion of the heat sink to connect the substrate and the heat sink.

* * * * *